(12) United States Patent
Yonezawa

(10) Patent No.: US 7,663,375 B2
(45) Date of Patent: Feb. 16, 2010

(54) BATTERY VOLTAGE DETECTING CIRCUIT

(75) Inventor: Yoshiaki Yonezawa, Gunma (JP)

(73) Assignees: Sanyo Electric Co., Ltd., Osaka (JP);
Sanyo Semiconductor Co., Ltd.,
Gunma (JP)

( * ) Notice: Subject to any disclaimer, the term of this patent is extended or adjusted under 35 U.S.C. 154(b) by 0 days.

(21) Appl. No.: 12/202,947

(22) Filed: Sep. 2, 2008

(65) Prior Publication Data

US 2009/0066338 A1  Mar. 12, 2009

(30) Foreign Application Priority Data

Sep. 7, 2007  (JP) .............................. 2007-233257

(51) Int. Cl.
*G01N 27/416* (2006.01)
(52) U.S. Cl. ...................... 324/434; 320/116; 324/433; 702/64
(58) Field of Classification Search ................. 320/116, 320/134; 324/426, 433, 434; 702/64
See application file for complete search history.

(56) References Cited

U.S. PATENT DOCUMENTS 6,462,550 B2 * 10/2002 Yudahira ..................... 324/426

6,803,766 B2 * 10/2004 Kobayashi et al. .......... 324/434
6,965,258 B2 * 11/2005 Bogner ........................ 327/94
7,078,908 B2 * 7/2006 Fujita et al. ................. 324/433

FOREIGN PATENT DOCUMENTS

JP  2002-243771  8/2002

* cited by examiner

*Primary Examiner*—Edward Tso
*Assistant Examiner*—Ramy Ramadan
(74) *Attorney, Agent, or Firm*—SoCal IP Law Group LLP; Steven C. Sereboff; John E. Gunther

(57) ABSTRACT

A battery voltage detecting circuit includes: a first capacitor having one end connected to one input terminal of an operational amplifier; a second capacitor having one end connected to an output terminal of the operational amplifier and the other end connected to the one input terminal of the operational amplifier; a third capacitor having one end connected to the other input terminal of the operational amplifier; a fourth capacitor having one end applied with a reference voltage and the other end connected to the other input terminal of the operational amplifier; and a switching circuit configured to electrically connect the one input terminal of the operational amplifier to the one end of the first capacitor after the transient current has stopped flowing.

5 Claims, 3 Drawing Sheets

BATTERY VOLTAGE DETECTING CIRCUIT

CROSS-REFERENCE TO RELATED APPLICATION

This application claims the benefit of priority to Japanese Patent Application No. 2007-233257, filed Sep. 7, 2007, of which full contents are incorporated herein by reference.

BACKGROUND OF THE INVENTION

1. Field of the Invention

The present invention relates to a battery voltage detecting circuit.

2. Description of the Related Art

In an apparatus such as a notebook-sized personal computer that uses rechargeable batteries, the voltage of each of the batteries needs to be highly precisely detected to manage recharge/discharge of each of the batteries that are connected in series. FIG. 3 depicts a common configuration of a battery voltage detecting circuit (see, for example, Japanese Patent Application Laid-Open Publication No. 2002-243771). A battery voltage detecting circuit 100 is used for detecting the voltages of four batteries BV1 to BV4 that are connected in series, and is configured including an operational amplifier 110, resistors R1 to R4, switches SW0M to SW4M and SW0P to SW3P, and a power source 115 that outputs a reference voltage $V_{REF}$. In such a battery voltage detecting circuit 100, when a voltage $V_{BV4}$ of the battery BV4 is to be detected, the switches SW4M and SW3P are turned on and other switches are turned off. Thereby, a voltage $V_{OUT}$ that corresponds to the difference between a voltage V4 of a plus terminal of the battery BV4 and a voltage V3 of a minus terminal thereof is output from the operational amplifier 110 to an AD converter (ADC) 120. The ADC 120 converts the voltage $V_{OUT}$ into a digital value and, thereby, the voltage $V_{BV4}$ of the battery BV4 can be detected. Similarly, the switches SW3M and SW2P are turned on and other switches are turned off and, thereby, a voltage $V_{BV3}$ of the battery BV3 can be detected. The switches SW2M and SW1P are turned on and other switches are turned off and, thereby, a voltage $V_{BV2}$ of the battery BV2 can be detected. Furthermore, the switches SW1M and SW0P are turned on and other switches are turned off and, thereby, a voltage $V_{BV1}$ of the battery BV1 can be detected.

When lithium ion batteries are used as the batteries BV1 to BV4, each of the voltages $V_{BV1}$ to $V_{BV4}$ between both terminals of each of the batteries BV1 to BV4 reaches about 4.5 V when the batteries are fully recharged. Assuming that each of the voltages $V_{BV1}$ to $V_{BV4}$ respectively of the batteries BV1 to BV4 is defined as 5 V taking the design allowance into account, the batteries BV1 to BV4 connected in series as a whole generate a voltage of 20 V and, therefore, the battery voltage detecting circuit 100 needs to be of a high-voltage type. On the other hand, a circuit including the ADC 120 in a control system generally uses a power source voltage of about 3 V and the voltage $V_{OUT}$ output from the battery voltage detecting circuit 100 needs to be 3.3 V or lower.

In this case, assuming that the resistance values of the resistors R3 and R4 respectively are R3 and R4, the gain $G_{AMP}$ of the operational amplifier 110 is R4/R3. Therefore, the $V_{OUT}$ output when the voltage $V_{BV4}$ of the battery BV4 is detected is $V_{OUT}=V_{BV4}/G_{AMP}+V_{REF}=(V4-V3)R3/R4+V_{REF}$. Assuming that $V_{BV4}$ is 5 V and $V_{REF}$ is 0.2 V, a condition for the gain $G_{AMP}$ of the operational amplifier 110 to be $V_{OUT} \leq 3.3$ V is that $G_{AMP} \leq (V_{OUT}-V_{REF})/V_{BV4}=(3.3-0.2)/5 \approx 0.6$. Based on this condition, the resistance values respectively of the resistors R3 and R4 are selected such that the gain $G_{AMP}$ of the operational amplifier 110 becomes about 0.6 and, thereby, the voltage $V_{OUT}$ output to the ADC 120 can be made 3.3 V or lower. However, in this case, the operational amplifier 110 needs to be of a high-voltage type and this results in increase of the cost of the battery voltage detecting circuit 100.

To make the operational amplifier 110 need not to be of a high-voltage type, the voltage applied to the operational amplifier 110 needs to be 3.3 V or lower. That is, to make the voltage $V^+$ applied to a + input terminal of the operational amplifier 110 be 3.3 V or lower, that $(V3-V_{REF})R4/(R3+R4)+V_{REF} \leq 3.3$ needs to be satisfied. This leads to $R4/(R3+R4) \leq (3.3-V_{REF})/(V3-V_{REF})=(3.3-0.2)/(15-0.2)=3.1/14.8 \approx 0.21$. Therefore, the gain $G_{AMP}$ of the operational amplifier 110 is $G_{AMP}=R4/R3 \leq 0.21/(1-0.21) \approx 0.26$. Therefore, by selecting the resistance values respectively of the resistors R3 and R4 such that the gain $G_{AMP}$ of the operational amplifier 110 is about 0.26, the operational amplifier 110 can be made need to not be of a high-voltage type. However, in this case, the voltage $V_{OUT}$ input into the ADC 120 goes low because the gain $G_{AMP}$ of the operational amplifier 110 is small. Therefore, to highly precisely detect the battery voltage, the ADC 120 needs to be of a high-precision type and this results in increase of the cost thereof.

In the battery voltage detecting circuit 100, when the voltages respectively of the batteries BV1 to BV4 are detected, a current flows through the resistors R1 and R3 that are connected to the input terminal of the operational amplifier 110. Therefore, to suppress the discharge of the batteries BV1 to BV4 caused by this current, high resistances such as about several mega ohms each need to be used as the resistances respectively of the resistors R1 and R3. To highly precisely detect the voltages respectively of the batteries BV1 to BV4, the resistors R1 to R4 need to be those that each have a low voltage-dependent resistance value. When an integrated circuit using resistors that each have a high resistance value with low voltage dependency as above is manufactured, special process steps need to be provided and this results in increase of the cost thereof.

SUMMARY OF THE INVENTION

A battery voltage detecting circuit according to an aspect of the present invention, includes: an operational amplifier; a first capacitor having one end connected to one input terminal of the operational amplifier; a second capacitor having one end connected to an output terminal of the operational amplifier and the other end connected to the one input terminal of the operational amplifier; a third capacitor having one end connected to the other input terminal of the operational amplifier; a fourth capacitor having one end applied with a reference voltage and the other end connected to the other input terminal of the operational amplifier; a first switching circuit configured to apply a voltage of one terminal of a battery to the other end of the first capacitor and to apply a voltage of the other terminal of the battery to the other end of the third capacitor; an energizing circuit configured to be energized with a transient current flowing into the first capacitor, when the voltage of the one terminal of the battery is applied to the other end of the first capacitor; a second switching circuit configured to electrically disconnect the one input terminal of the operational amplifier from the one end of the first capacitor while the transient current is flowing, and to electrically connect the one input terminal of the operational amplifier to the one end of the first capacitor after the transient current has stopped flowing; a discharging circuit configured to discharge the second and the fourth capacitors; and a third switching circuit configured to apply a voltage of the other terminal of the battery to the other end of the first capacitor after the one input terminal of the operational amplifier and the one end of the first capacitor have been electrically connected to each other and the second and the fourth capacitors have been discharged, the voltage of the battery being detected based on the voltage of the output terminal of the operational amplifier after the voltage of the other terminal of the battery has been applied to the other end of the first capacitor.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
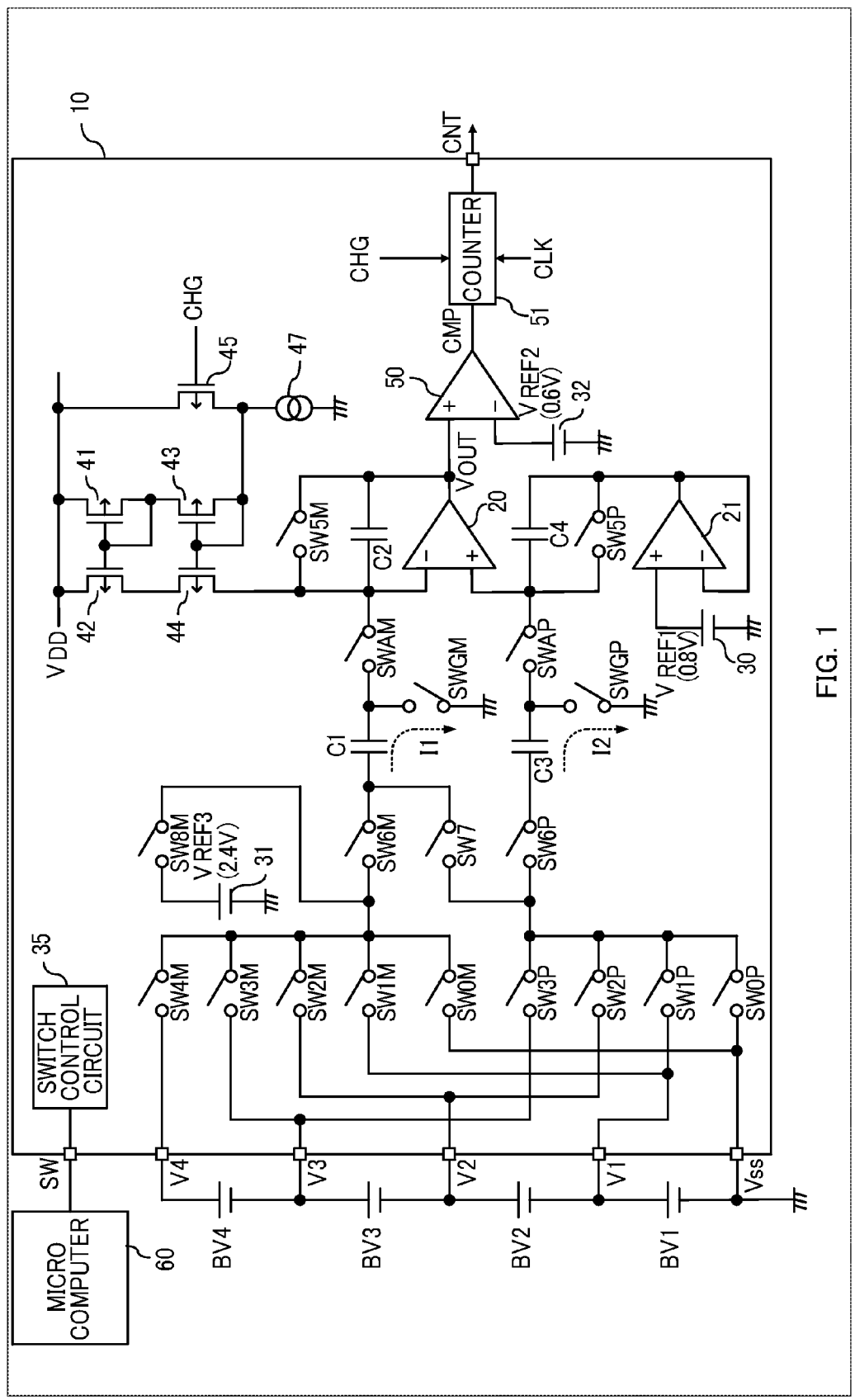
FIG. 1 depicts the configuration of a battery voltage detecting circuit that is an embodiment of the present invention.

FIG. 1 depicts the configuration of a battery voltage detecting circuit that is an embodiment of the present invention. A battery voltage detecting circuit 10 includes: operational amplifiers 20 and 21; capacitors C1 to C4; switches SW0P to SW3P, SW5P, SW6P, SW0M to SW6M, SW7, SW8M, SWAM, SWAP, SWGM, and SWGP; power supplies 30 to 32; a switch control circuit 35; P-channel MOSFETs 41 to 45; a current source 47; a comparator 50; and a counter 51.

The operational amplifier 20 (first operational amplifier) is a circuit that outputs an output voltage $V_{OUT}$ that corresponds to each of the voltages respectively of the batteries BV1 to BV4, and a − input terminal thereof is connected to the capacitor C1 through the switch SWAM and a + input terminal thereof is connected to the capacitor C3 through the switch SWAP. As above, the operational amplifier 20 needs not to be of a high-voltage type because no DC voltage is applied to the operational amplifier 20.

The power supplies 30 to 32 are power supplying circuits that respectively output reference voltages $V_{REF1}$ to $V_{REF3}$ and, in the embodiment, it is assumed that $V_{REF1}=0.8$ V, $V_{REF2}=0.6$ V, and $V_{REF3}=2.4$ V. The operational amplifier 21 (second operational amplifier) is used as a buffer circuit that outputs from an output terminal thereof the reference voltage $V_{REF1}$ that is output from the power source 30.

The switch control circuit 35 controls turning on and off of each of the switches SW0P to SW3P, SW5P, SW6P, SW0M to SW6M, SW7, SW8M, SWAM, SWAP, SWGM, and SWGP based on a signal input from a micro computer 60 through a terminal SW. The function same as that of the switch control circuit 35 can also be realized by software.

The comparator 50 outputs a signal CMP that represents the comparison result between the output voltage $V_{OUT}$ output from the operational amplifier 20 and the reference voltage $V_{REF2}$ output from the power source 32. In the embodiment, the signal CMP is high when the output voltage $V_{OUT}$ is higher than the reference voltage $V_{REF2}$, and the signal CMP is low when the output voltage $V_{OUT}$ is lower than the reference voltage $V_{REF2}$.

The counter 51 is a circuit that outputs a count value CNT that corresponds to the voltage of each of the batteries BV1 to BV4, and is input with a signal CHG that is output from the switch control circuit 35, the signal CMP output from the comparator 50, and a clock signal CLK at a predetermined frequency generated by, for example, an RC oscillator circuit. The counter 51 starts counting up the count value CNT based on the clock signal CLK when the level of the signal CHG varies from low to high, and stops the counting when the level of the signal CMP varies from high to low.

In the embodiment, the capacitances respectively of the capacitors C1 to C4 are denoted respectively by C1 to C4 and the relation C1/C2=C3/C4 is satisfied. The capacitors C1 to C4 respectively correspond to a first to a fourth capacitors of the present invention. The switches SW0P to SW3P, SW1M to SW4M, SW6M, and SW6P collectively correspond to a first switching circuit of the present invention. The switches SWAM and SWAP collectively correspond to a second switching circuit of the present invention. The switch SW7 corresponds to a third switching circuit of the present invention. The switches SW5M and SW5P collectively correspond to a discharging circuit of the present invention. The switches SWGM and SWGP collectively correspond to an energizing circuit of the present invention. The switch SWGM corresponds to a fourth switching circuit of the present invention. The switch SWGP corresponds to a fifth switching circuit of the present invention.

Assuming that lithium ion batteries are used as the batteries BV1 to BV4, each of voltages $V_{BV1}$ to $V_{BV4}$ between both terminals respectively of the batteries BV1 to BV4 reach about 4.5 V. Assuming that each of the voltages $V_{BV1}$ to $V_{BV4}$ respectively of the batteries BV1 to BV4 is defined as 5 V taking the design allowance into account, the batteries BV1 to BV4 connected in series as a whole generate a voltage of 20 V and, therefore, the capacitors C1 and C3 need to be of a high-voltage type. Therefore, in the embodiment, the capacitors C1 to C4 are configured using wiring capacity that generally has low voltage-dependency.

Figure 2:
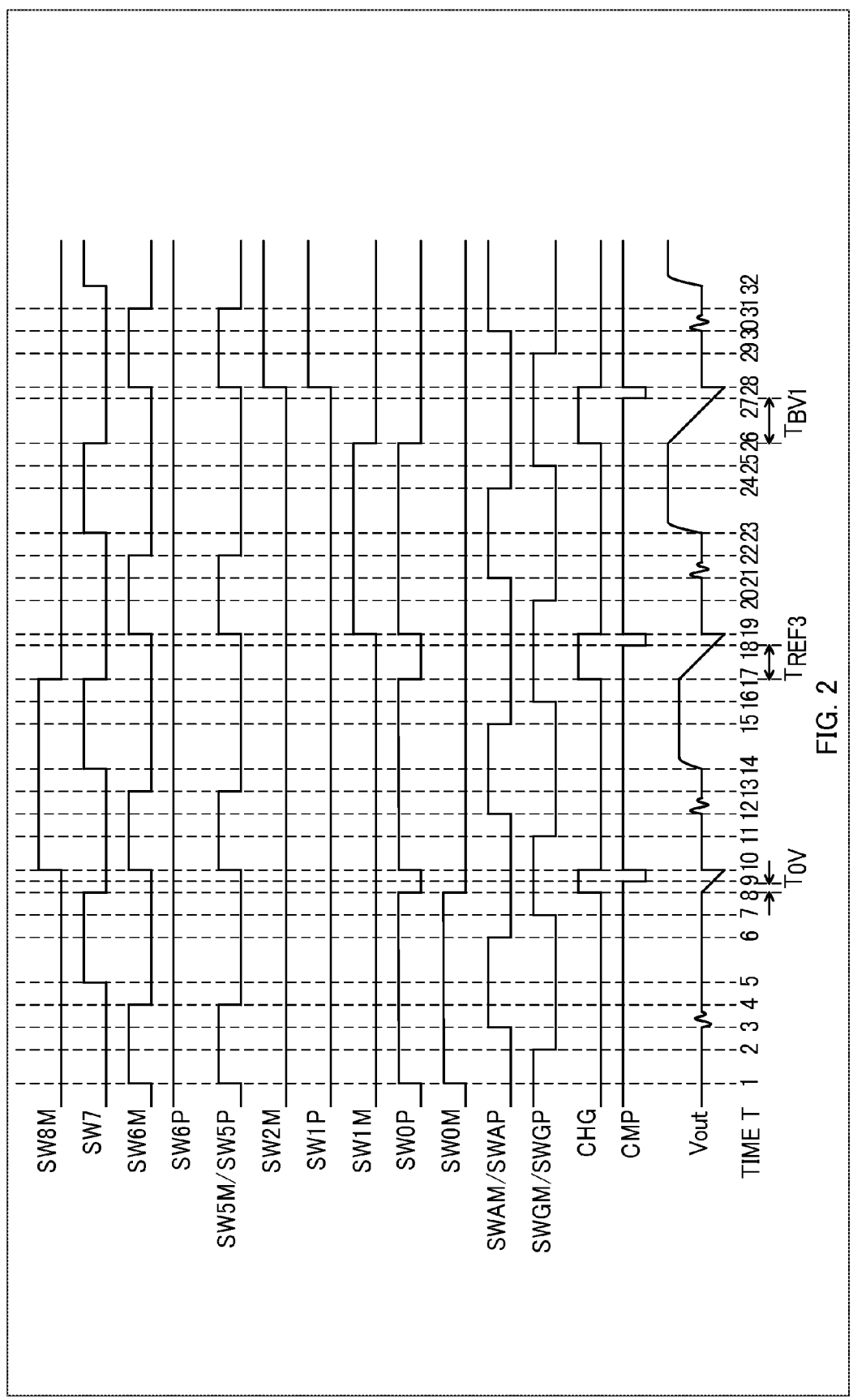
FIG. 2 is a timing chart of an example of operations of the battery voltage detecting circuit.
Figure 3:
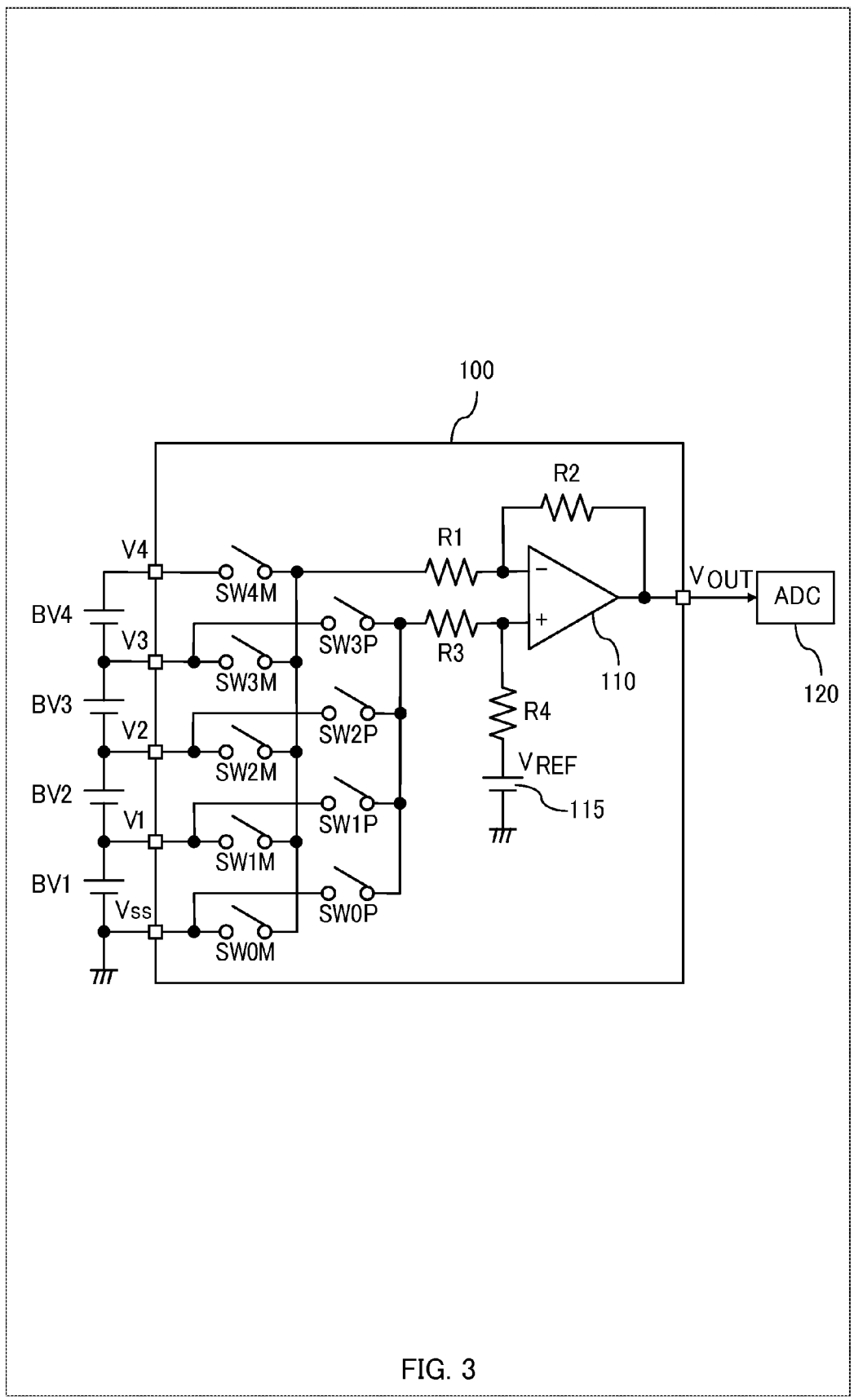
FIG. 3 depicts a common configuration of a battery voltage detecting circuit.

Description will be given for operations of the battery voltage detecting circuit 10. FIG. 2 is a timing chart of an example of the operations of the battery voltage detecting circuit 10. Voltages respectively applied to terminals V1 to V4 are respectively denoted by V1 to V4. Voltages of the batteries BV1 to BV4 are respectively denoted by $V_{BV1}$ to $V_{BV4}$. In FIG. 2, for each of the switches SW0P to SW3P, SW5P, SW6P, SW0M to SW6M, SW7, SW8M, SWAM, SWAP, SWGM, and SWGP, it is assumed that a high level thereof is the on state thereof and a low level thereof is the off state thereof. During the time period shown in FIG. 2, the switches SW2P, SW3M, SW3P, SW4M are in the off state.

At a time T1, the switches SWGM, SWGP, SW0M, SW0P, SW5M, SW5P, SW6P, and SW8M are turned on and the switches SWAM, SWAP, SW1P to SW3P, SW1M to SW4M, SW7, and SW8M are turned off.

At this time, because the switches SW5M and SW5P are turned on, the operational amplifier 20 turns to an amplifier having the gain of one and the reference voltage $V_{REF1}=0.8$ V applied to a + input terminal thereof is output as the output voltage $V_{OUT}$. In addition, because the switches SW5M and SW5P are turned on, the capacitors C2 and C4 are discharged.

Because the switches 0M, SW6M, and SWGM are turned on, a voltage $V_{C1}$ between the both ends of the capacitor C1 becomes $V_{C1}=0$ V. Similarly, because the switches SW0P, SW6P, and SWGP are turned on, a voltage $V_{C3}$ between the both ends of the capacitor C3 becomes $V_{C3}$=0 V.

Thereafter, at a time T2, the switches SWGM and SWGP are turned off and, at a time T3, the switches SWAM and SWAP are turned on. At this time, the voltage of a terminal on the switch-SWAM-side of the capacitor C1 varies from 0 V to 0.8 V and a transient response corresponding to the reference voltage $V_{REF}$ (0.8 V) is generated on the output voltage $V_{OUT}$. However, because the variation of the voltage is 0.8 V and this is small, the duration of the transient response is short compared to, for example, the case where the variation of the voltage is equal to the reference voltage $V_{REF}$ (2.4 V) or a voltage (about 5 V) of each of the batteries BV1 to BV4.

Thereafter, at a time T4, the switches SW5M, SW5P, and SW6M are turned off and, at a time T5, the switch SW7 is turned on. At this time, because the voltage applied to the capacitor C1 is not varied, each voltage between the both ends of each of the capacitors C1 and C2 and the output voltage $V_{OUT}$ are not varied.

At a time T6, the switches SWAM and SWAP are turned off and, at a time T7, the switches SWGM and SWGP are turned on. At a time T8, the switches SW0M, SW0P, and SW7 are turned off and the level of the signal CHG shifts to high. By the shift of the level of the signal CHG to high, the P-channel MOSFET 45 is turned off and, thereby, a constant current corresponding to a current generated by the current source 47 flows from the P-channel MOSFET 44 to the capacitor C2 and the output terminal of the operational amplifier 20. Due to this constant current, a charge accumulated in the capacitor C2 is discharged at a constant rate and the output voltage $V_{OUT}$ is reduced at a constant rate. Due to the shift of the level of the signal CHG to high, the counter 51 starts counting up the count value CNT based on the clock signal CLK.

Thereafter, at a time T9, when the output voltage $V_{OUT}$ becomes lower than 0.6 V that is the reference voltage $V_{REF}$ to be applied to the − input terminal of the comparator 50, the level of the output signal CMP of the comparator 50 shifts to low and the counter 51 stops the counting. Thereby, the micro computer 60 can measure a time period $T_{0V}$ spanning over the time T8 to the time T9. The measured time period $T_{0V}$ is a time period that corresponds to a ground voltage $V_{SS}$ (=0 V). At a time T10, when the level of the signal CHG shifts to low, the P-channel MOSFET 45 is turned on and the discharge of the capacitor C2 due to the constant current is stopped.

While the time period $V_{0V}$ is being measured, the switches SWAM and AWAP are off and the switches SWGM and SWGP are on. Therefore, the influence from the switches SWAM and SWAP on charges respectively of the capacitors C2 and C4 due to the circuit on the side of the capacitors C1 and C3 can be suppressed and, therefore, the precision of the voltage detection can be improved.

At a time T10, the switches SW0P, SW5M, SW5P, SW6M, and SW8M are turned on. Due to the being turned on of the switches SW5M and SW5P, the output voltage $V_{OUT}$ becomes equal to the reference voltage $V_{REF}$=0.8 V and the level of the output signal CMP of the comparator 50 shifts to high. Because the switches SW8M and SWGM are on, the capacitor C1 is recharged by a current I1 (a transient current) flowing from the power source 31 to the switch SWGM through the capacitor C1 and the voltage $V_{C1}$ between the both ends of the capacitor C1 becomes $V_{C1}$=$V_{REF3}$. Because the switch SWAM is off, the current I1 does not flow into the output terminal of the operational amplifier 20 and a transient response caused by the current I1 does not appear on the output voltage $V_{OUT}$. Because the switches SW0P, SW6P, and SWGP are on, the voltage $V_{C3}$ of the capacitor C3 becomes $V_{C3}$=0 V.

When the recharge of the capacitor C1 has been finished and the current I1 stops flowing, at a time T11, the switches SWGM and SWGP are turned off and, at a time T12, the switches SWAM and SWAP are turned on. At this time, the voltage of the terminal on the side of the switch SWAM of the capacitor C1 is varied from 0 V to 0.8 V and the voltage $V_{C1}$ of the capacitor C1 becomes $V_{C1}$=$V_{REF3}$−$V_{REF1}$ and a transient response corresponding to the reference voltage $V_{REF1}$ (0.8 V) is generated to the output voltage $V_{OUT}$. However, because the variation of the voltage is 0.8 V and this is small, the duration of the transient response is short compared to, for example, the case where the variation of the voltage is equal to the reference voltage $V_{REF3}$ (2.4 V) or the voltage (about 5 V) of each of the batteries BV1 to BV4.

The timing at which the switches SWGM and SWGP are turned off may be a time a predetermined time period after the time when the switches SWGM and SWGP are turned on or, when a current detecting circuit that detects a current flowing through the switches SWGM and SWGP has been provided, may be a time after detecting that no current flows through the switches SWGM and SWGP.

Thereafter, at a time T13, the switches SW5M, SW5P, and SW8M are turned off and, at a time T14, the switch SW7 is turned on. Thereby, the ground voltage $V_{SS}$ (0 V) is applied to the capacitor C1 and a current flows from the output terminal of the operational amplifier 20 toward the capacitors C1 and C2, the switches SWAM, SW7, and SW0P, and the terminal $V_{SS}$. Thereby, a charge is accumulated in the capacitor C2 and the output voltage $V_{OUT}$ is increased.

When the charge in the capacitor C1 becomes stable, at a time T15, the switches SWAM and SWAP are turned off and, at a time T16, the switches SWGM and SWGP are turned on. When the charge in the capacitor C1 is stable, $V_{C1}$ is $V_{C1}$=$V_{SS}$−$V_{REF1}$. Therefore, the variation $\Delta Q_{C1}$ of the charge $Q_{C1}$ of the capacitor C1 is $\Delta Q_{C1}$=($V_{REF3}$−$V_{REF1}$)·C1−($V_{SS}$−$V_{REF1}$)·C1=$V_{REF3}$·C1. Because the same amount of charge as $\Delta Q_{C1}$ is also accumulated in the capacitor C2, the charge $Q_{C2}$ of the capacitor C2 becomes $Q_{C2}$=$V_{REF3}$·C1. Therefore, the voltage $V_{C2}$ between the both ends of the capacitor C2 becomes $V_{C2}$=$V_{REF3}$·C1/C2 and the output voltage $V_{OUT}$ becomes $V_{OUT}$=$V_{REF1}$+$V_{C2}$=$V_{REF1}$+$V_{REF3}$·C1/C2.

At a time T17, the switches SW0P and SW7 are turned off and the level of the signal CHG shifts to high. By the shift of the level of the signal CHG to high, the P-channel MOSFET 45 is turned off and a constant current corresponding to a current generated by the current source 47 flows from the P-channel MOSFET 44 to the capacitor C2 and the output terminal of the operational amplifier 20. Due to this constant current, the charge accumulated in the capacitor C2 is discharged at a constant rate and the output voltage $V_{OUT}$ is reduced at a constant rate. Due to the shift of the level of the signal CHG to high, the counter 51 starts counting up the count value CNT based on the clock signal CLK.

Thereafter, at a time T18, when the output voltage $V_{OUT}$ becomes lower than 0.6 V that is the reference voltage $V_{REF2}$ to be applied to the − input terminal of the comparator 50, the level of the output signal CMP of the comparator 50 shifts to low and the counter 51 stops the counting. Thereby, the micro computer 60 can measure a time period $T_{REF3}$ spanning over the time T17 to the time T18. At a time T19, when the level of the signal CHG shifts to low, the P-channel MOSFET 45 is turned on and the discharge of the capacitor C2 due to the constant current is stopped.

While the time period $V_{REF3}$ is being measured, the switches SWAM and AWAP are off and the switches SWGM and SWGP are on. Therefore, the influence from the switches SWAM and SWAP on charges respectively of the capacitors C2 and C4 due to the circuit on the side of the capacitors C1 and C3 can be suppressed and, therefore, the precision of the voltage detection can be improved.

At a time T19, the switches SW1M, SW0P, SW5M, SW5P, and SW6M are turned on. Due to the being turned on of the switches SW5M and SW5P, the output voltage $V_{OUT}$ becomes equal to the reference voltage $V_{REF1}$=0.8 V and the level of the output signal CMP of the comparator 50 shifts to high. Because the switches SW1M, SW6M, and SWGM are on, the capacitor C1 is recharged by the current I1 (the transient current) flowing from the terminal V1 to the switch SWGM through the capacitor C1 and the voltage $V_{C1}$ between the both ends of the capacitor C1 becomes $V_{C1}$=V1. Because the switch SWAM is off, the current I1 does not flow into the output terminal of the operational amplifier 20 and the transient response by the current I1 does not appear on the output voltage $V_{OUT}$. Because the switches SW0P, SW6P, and SWGP are on, the voltage $V_{C3}$ of the capacitor C3 becomes $V_{C3}$=0 V.

When the recharge of the capacitor C1 has been finished and the current I1 stops flowing, at a time T20, the switches SWGM and SWGP are turned off and, at a time T21, the switches SWAM and SWAP are turned on. At this time, the voltage of the terminal on the side of the switch SWAM of the capacitor C1 is varied from 0 V to 0.8 V and the voltage $V_{C1}$ of the capacitor C1 becomes $V_{C1}$=V1−$V_{REF1}$ and a transient response corresponding to the reference voltage $V_{REF1}$ (0.8 V) is generated to the output voltage $V_{OUT}$. However, similarly to the case of the time T12, because the variation of the voltage is 0.8 V that is small, the duration of the transient response is short.

Thereafter, at a time T22, the switches SW5M, SW5P, and SW8M are turned off and, at a time T23, the switch SW7 is turned on. Thereby, the ground voltage $V_{SS}$ (0 V) is applied to the capacitor C1 and a current flows from the output terminal of the operational amplifier 20 toward the capacitors C1 and C2, the switches SWAM, SW7, and SW0P, and the terminal $V_{SS}$. Thereby, a charge corresponding to the voltage $V_{BV1}$ is accumulated in the capacitor C2.

At a time T24, the switches SWAM and SWAP are turned off and, at a time T25, the switches SWGM and SWGP are turned on. At a time T26, the switches SW0P, SW1M, and SW7 are turned off and the signal CHG shifts to high. By the shift of the level of the signal CHG to high, a charge accumulated in the capacitor C2 is discharged at a constant rate and the output voltage $V_{OUT}$ is reduced at a constant rate. At a time T27, when the output voltage $V_{OUT}$ becomes lower than the reference voltage $T_{REF2}$, the level of the output signal CMP of the comparator 50 shifts to low and the counter 51 stops the counting. Thereby, the micro computer 60 can measure a time period $T_{BV1}$ spanning over the time T26 to the time T27.

The micro computer 60 can obtain the voltage $V_{BV1}$ of the battery BV1 based on $T_{0V}$, $T_{REF3}$, and $T_{BV1}$ measured by the counter 51. More specifically, a time period obtained by subtracting $T_{0V}$ from $T_{REF3}$ is the time period that corresponds to the voltage $V_{REF3}$ and a time period obtained by subtracting $T_{0V}$ from $T_{BV1}$ is the time period that corresponds to the voltage $V_{BV1}$. Therefore, the relation, $V_{BV1}/V_{REF3}$=($T_{BV1}$−$T_{0V}$)/($T_{REF3}$−$T_{0V}$) is satisfied and $V_{BV1}$ becomes $V_{BV1}$={($T_{BV1}$−$T_{0V}$)/($T_{REF3}$−$T_{0V}$)}$V_{REF3}$.

In this manner, the voltage $V_{BV1}$ is obtained by comparing the count value $T_{REF3}$ for the case of the reference voltage $V_{REF3}$ and the count value $T_{BV1}$ for the case of the voltage $V_{BV1}$ of the battery BV1 and, thereby, the precision for detecting the battery voltages can be obtained. For example, in the case where the clock signal CLK is generated by a circuit having low precision such as an RC oscillation circuit, when the voltage $V_{BV1}$ of the battery BV1 is obtained based only on $T_{BV1}$ measured by the counter 51, the precision for detecting the voltage $V_{BV1}$ is lowered due to the influence from the variation of the clock frequency caused by the variation of the temperature, etc. Therefore, as shown in the embodiment, the influence from the variation of the clock frequency can be cancelled by comparing the count value $T_{BV1}$ with the count value $T_{REF3}$ for the case of the predetermined reference voltage $V_{REF3}$ and the voltage of the battery can be highly precisely detected.

At a time T28, the switches SW2M, SW1P, SW5M, SW5P, and SW6M are turned on. Due to the being turned on of the switches SW5M and SW5P, the output voltage $V_{OUT}$ becomes equal to the reference voltage $T_{REF1}$=0.8 V and the level of the output signal CMP of the comparator 50 shifts to high. Because the switches SW2M, SW6M, and SWGM are on, the capacitor C1 is recharged by the current I1 (the transient current) that flows from the terminal V2 to the switch SWGM through the capacitor C1 and the voltage $V_{C1}$ between the both ends of the capacitor C1 becomes $V_{C1}$=V2. Because the switch SWAM is off, the current I1 does not flow into the output terminal of the operational amplifier 20 and the transient response caused by the current I1 does not appear on the output voltage $V_{OUT}$. Because the switches SW1P, SW6P, and SWGP are on, the capacitor C3 is recharged by a current I2 (a transient current) that flows from the terminal V1 to the switch SWGP through the capacitor C3 and the voltage $V_{C3}$ between the both ends of the capacitor C3 becomes $V_{C3}$=V1. Because the switch SWAP is on, the current I2 does not flow into the output terminal of the operational amplifier 21 and the transient response does not appear on the reference voltage $V_{REF1}$ output from the output terminal of the operational amplifier 21.

When the recharge of the capacitors C1 and C2 has been finished and the currents I1 and I2 stop flowing, at a time T29, the switches SWGM and SWGP are turned off and, at a time T30, the switches SWAM and SWAP are turned on. At this time, the voltage of the terminal on the side of the switch SWAM of the capacitor C1 is varied from 0 V to 0.8 V and the voltage $V_{C1}$ between the both ends of the capacitor C1 becomes $V_{C1}$=V2−$V_{REF1}$ and a transient response corresponding to the reference voltage $V_{REF1}$ (0.8 V) is generated to the output voltage $V_{OUT}$. Similarly, the voltage of the terminal on the side of the switch SWAP of the capacitor C3 is varied from 0 V to 0.8 V and the voltage $V_{C3}$ between the both ends of the capacitor C3 becomes $V_{C3}$=V1−$V_{REF1}$ and a transient response corresponding to the reference voltage $V_{REF1}$ (0.8 V) is generated to the output of the operational amplifier 21. Similarly to the case of the time T12, because the variation of the voltage is 0.8 V that is small, the duration of the transient response is short.

Thereafter, at a time T31, the switches SW5M, SW5P, and SW8M are turned off and, at a time T32, the switch SW7 is turned on. Thereby, the voltage V1 is applied to the capacitor C1 and a current flows from the output terminal of the operational amplifier 20 toward the capacitors C1 and C2, the switches SWAM, SW7, and SW1P, and the terminal V1. Thereby, a charge corresponding to the voltage $V_{BV2}$ (=V2−V1) is accumulated in the capacitor C2 and the voltage $V_{BV2}$ is detected. Thereafter, the voltages $V_{BV3}$ and $V_{BV4}$ are detected by executing the same process steps.

In the case where the batteries BV1 to BV4 are used as a driving power source of, for example, a notebook-sized personal computer, the voltages V1 to V4 may be simultaneously reduced by the same amount when the load to be processed is increased, etc. Assuming that, for example, after the recharge of the capacitor C2 has been started at the time T32 and the output voltage $V_{OUT}$ has become stable, a phenomenon that the voltage V1 is reduced to V1' occurs. Thereby, the current flows more from the output terminal of the operational amplifier 20 toward the capacitors C1 and C2, the switches SWAM, SW7, and SW1P, and the terminal V1 because the voltage applied to the capacitor C1 is reduced from V1 to V1'. In addition, a current flows from the output terminal of the operational amplifier 21 toward the capacitors C3 and C4, the switches SWAP, SW1P, and SW6P, and the terminal V1 because the voltage applied to the capacitor C3 is also reduced from V1 to V1'.

At this time, the variation $\Delta Q_{C3}$ of the charge $Q_{C3}$ of the capacitor C3 is $\Delta Q_{C3}=(V1-V1')\cdot C3$. Because the same amount of charge as $\Delta Q_{C3}$ is also accumulated in the capacitor C4, the charge $Q_{C4}$ of the capacitor C4 becomes $Q_{C4}=(V1-V')\cdot C3$. Therefore, the voltage $V_{C4}$ between the both ends of the capacitor C4 becomes $V_{C4}=(V1-V1')\cdot C3/C4$ and the voltage $V^+$ applied to the + input terminal of the operational amplifier 20 becomes $V_{REF1}-V_{C4}$. The variation $\Delta Q_{C1}$ of the charge $Q_{C1}$ of the capacitor C1 is $\Delta Q_{C1}=(V1-V1')\cdot C1$. Because the same amount of charge as $\Delta Q_{C1}$ is also accumulated in the capacitor C2, the charge $Q_{C2}$ of the capacitor C2 becomes $Q_{C2}=(V2-V1)\cdot C1+(V1-V1')\cdot C1=(V2-V1')\cdot C1$. Therefore, the voltage $V_{C2}$ between the both ends of the capacitor C2 becomes $V_{C2}=(V2-V1')\cdot C1/C2$. The voltage $V^-$ applied to the – input terminal of the operational amplifier 20 becomes $V^-=V^+=V_{REF1}-V_{C4}=V_{REF1}-(V1-V1')\cdot C3/C4$. Therefore, the output voltage $V_{OUT}$ of the operational amplifier 20 becomes $V_{OUT}=V_{REF1}-(V1-V1')\cdot C3/C4+(V2-V1)\cdot C1/C2=V_{REF1}+(V2-V1)\cdot C1/C2=V_{REF1}+V_{BV4}\cdot C1/C2$. From this, it can be seen that the output voltage $V_{OUT}$ is not influenced by the reduction of the voltage V1.

That is, even when the voltages V1 to V4 are simultaneously reduced by the same amount, because the switch SW7 is on, the variations respectively of the voltages of the + and − terminals of the operational amplifier 20 are almost same and the output voltage $V_{OUT}$ is not varied. Therefore, the voltage of each of the batteries can be highly precisely detected regardless of the timing.

The order of detecting the voltages respectively of the batteries BV1 to BV4 is not limited to the order of $V_{BV1}$, $V_{BV2}$, $V_{BV3}$, and $V_{BV4}$ and may be any arbitrary order. Depending on the order of the detection of the voltages, the voltages to be applied respectively to the capacitors C1 and C2 may be reduced at the timing at which the switches SW1M to SW4M, and SW0P to SW3P are turned on. Even in such a case, the transient response of the output terminals of the operational amplifiers 20 and 21 can be suppressed by turning on the switches SWGM and SWGP, turning off the switches SWAM and SWAP, and energizing the SWGM and SWGP respectively using the transient currents respectively flowing the capacitors C1 and C2.

As above, description has been given for the embodiment of the present invention. As described, in the battery voltage detecting circuit 10, not resistors but the capacitors C1 to C4 are used to differentially amplify using the operational amplifier 20. Therefore, no DC voltage of any of the batteries BV1 to BV4 is applied to the operational amplifier 20 and, therefore, the operational amplifier 20 needs not to be of a high-voltage type. Furthermore, the voltage level of the output voltage $V_{OTU}$ can also be increased by adjusting the capacitance ratio of the capacitors C1 to C4. Therefore, using a high-precision-type AD converter is not necessary. Therefore, the battery voltages can be highly precisely detected at a low cost. Even when the voltages V1 to V4 are simultaneously reduced by the same amount due to, for example, increase of the load to be processed, the voltage variations respectively at the + and − input terminals of the operational amplifier 20 are same because the switch SW7 is on. Therefore, in such a case, the output voltage $V_{OUT}$ is not varied and the voltages of the batteries can be highly precisely detected.

In the case where the voltages V1 to V4 are applied to the capacitor C1 when the switch 5M is on, the switch SWAM is off and the switch SWGM is on. Therefore, the appearance of the transient response on the output of the operational amplifier 20 can be suppressed by the current flowing into the capacitor C1. When the switch SWGM is turned off and the switch SWAM is turned on, a transient response appears corresponding to the voltage level of the reference voltage $V_{REF1}$. However, the response is at low level compared to that of the voltage of any of the batteries and, therefore, the duration of the transient response is short. Therefore, the time period to obtain the detection result of the voltages of the batteries can be reduced.

In the case where the voltages $V_{SS}$ to V3 are applied to the capacitor C3 when the switch SW5P is on, the switch SWAP is off and the switch SWGP is on. Therefore, the appearance of the transient response on the output of the operational amplifier 21 can be suppressed by the current flowing into the capacitor C3. When the switch SWGP is turned off and the switch SWAP is turned on, a transient response appears corresponding to the voltage level of the reference voltage $V_{REF1}$. However, the response is at low level compared to that of the voltage of any of the batteries and, therefore, the duration of the transient response is short. Therefore, the time period to obtain the detection result of the voltages of the batteries can be reduced. By providing the operational amplifier 21, the capacitor C1-side and the capacitor C3-side are caused to make the circuit configuration symmetrical and the detection precision of the voltages of the batteries can be improved.

By the being turned off of the switches SWAM and SWAP after the charges corresponding respectively to the voltages of the batteries have been accumulated, the influence from the Switches SWAM and SWAP on the charge in the capacitor C2 due to the circuit on the side of the capacitors C1 and C3 can be suppressed and the detection precision of the voltages of the batteries can be improved.

Furthermore, after the switches SWAM and SWAP are turned off, the switches SWGM and SWGP are turned on and, thereby, the terminal of each of the capacitors C1 and C3 becomes at the predetermined level and, thereby, the circuit from the switches SWAM and SWAP on the side of the capacitors C1 and C3 becomes stable. Therefore, the influence on the charge in the capacitor C2 can be more suppressed.

The above embodiments of the present invention are simply for facilitating the understanding of the present invention and are not in any way to be construed as limiting the present invention. The present invention may variously be changed or altered without departing from its spirit and encompass equivalents thereof.

In the embodiment, for example, the switches SWGM and SWGP are used as energizing circuits to be energized with the transient current flowing into the capacitors C1 and C3. However, the energizing circuits are not limited to the above and diodes, etc., may be used.

What is claimed is:
1. A battery voltage detecting circuit comprising:
a first operational amplifier;
a first capacitor having one end connected to one input terminal of the first operational amplifier;

a second capacitor having one end connected to an output terminal of the first operational amplifier and the other end connected to the one input terminal of the first operational amplifier;

a third capacitor having one end connected to the other input terminal of the first operational amplifier;

a fourth capacitor having one end applied with a reference voltage and the other end connected to the other input terminal of the first operational amplifier;

a first switching circuit configured to apply a voltage of one terminal of a battery to the other end of the first capacitor and to apply a voltage of the other terminal of the battery to the other end of the third capacitor;

an energizing circuit configured to be energized with a transient current flowing into the first capacitor, when the voltage of the one terminal of the battery is applied to the other end of the first capacitor;

a second switching circuit configured to electrically disconnect the one input terminal of the first operational amplifier from the one end of the first capacitor while the transient current is flowing, and to electrically connect the one input terminal of the first operational amplifier to the one end of the first capacitor after the transient current has stopped flowing;

a discharging circuit configured to discharge the second and the fourth capacitors; and a third switching circuit configured to apply a voltage of the other terminal of the battery to the other end of the first capacitor after the one input terminal of the first operational amplifier and the one end of the first capacitor have been electrically connected to each other and the second and the fourth capacitors have been discharged, the voltage of the battery being detected based on the voltage of the output terminal of the first operational amplifier after the voltage of the other terminal of the battery has been applied to the other end of the first capacitor.

2. The battery voltage detecting circuit of claim 1, wherein the energizing circuit includes a fourth switching circuit having one end connected to the one end of the first capacitor and the other end applied with a voltage of a predetermined level, the fourth switching circuit being configured to be turned on when the voltage of the one terminal of the battery is applied to the other end of the first capacitor, and to be turned off after the transient current has stopped flowing into the first capacitor.

3. The battery voltage detecting circuit of claim 2, further comprising a second operational amplifier having one input terminal applied with the reference voltage, an output terminal connected to the other terminal of the fourth capacitor, and the other input terminal connected to the output terminal thereof, wherein the energizing circuit further includes a fifth switching circuit having one end connected to the one end of the third capacitor and the other end applied with a voltage of a predetermined level, the fifth switching circuit being configured to be turned on when the voltage of the other terminal of the battery is applied to the other end of the third capacitor, and to be turned off after the transient current has stopped flowing into the third capacitor, and wherein the second switching circuit is configured to electrically disconnect respectively the one input terminal and the other input terminal of the first operational amplifier from the one end of the first capacitor and the one end of the third capacitor while the transient current is flowing, and to electrically connect respectively the one input terminal and the other input terminal of the first operational amplifier to the one end of the first capacitor and the one end of the third capacitor after the transient current has stopped flowing.

4. The battery voltage detecting circuit of claim 3, wherein the second switching circuit is configured to electrically disconnect respectively the one input terminal and the other input terminal of the first operational amplifier from the one end of the first capacitor and the one end of the third capacitor after the voltage of the other terminal of the battery has been applied to the other end of the first capacitor and the second capacitor has been charged.

5. The battery voltage detecting circuit of claim 4, wherein the fourth and the fifth switching circuits are configured to be turned on after: the voltage of the other terminal of the battery has been applied to the other end of the first capacitor; the second capacitor has been charged; and the one input terminal and the other input terminal of the first operational amplifier have been electrically disconnected respectively from the one end of the first capacitor and the one end of the third capacitor.

* * * * *